(12) United States Patent
Krautschik

(10) Patent No.: US 6,781,670 B2
(45) Date of Patent: Aug. 24, 2004

(54) IMMERSION LITHOGRAPHY

(75) Inventor: Christof Gabriel Krautschik, Cupertino, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/335,205

(22) Filed: Dec. 30, 2002

(65) Prior Publication Data

US 2004/0125351 A1 Jul. 1, 2004

(51) Int. Cl.[7] .................. G03B 27/42; G03B 27/52; A61N 5/00
(52) U.S. Cl. ................. 355/53; 355/55; 355/63; 250/492.2
(58) Field of Search .................. 355/53, 55, 63, 355/71, 77; 359/886, 665; 252/582; 250/492.24, 492.2

(56) References Cited

U.S. PATENT DOCUMENTS 5,715,039 A * 2/1998 Fukuda et al. ............. 355/53
6,448,568 B1 * 9/2002 Allen et al. ............ 250/492.24
2002/0163629 A1 * 11/2002 Switkes et al. ............. 355/53

OTHER PUBLICATIONS

Abramowitz, M. et al., "Immersion Media", Printed Mar. 12, 2002 from the Internet, URL: http://micro.magnet.fsu.edu/primer/anatomy/immersion.html, copyright 1998–2002, 9 pages.

Spring, K. et al., "Immersion Oil and Refractive Index", Printed Mar. 12, 2002 from the Internet, URL: http://micro.magnet.fsu.edu/primer/java/microscopy/immersion/index.html, copyright 1998–2002, 3 pages.

* cited by examiner

Primary Examiner—Peter B. Kim
(74) Attorney, Agent, or Firm—Fish & Richardson P.C.

(57) ABSTRACT

Apparatus, methods, and systems for immersion lithography. In one implementation, a hemispherical lens element is positioned near a target surface covered by photoresist. An immersion liquid is juxtaposed between the target surface and the lens element. A projected light is directed through the lens element and the immersion liquid to image a mask on the target surface.

19 Claims, 5 Drawing Sheets

IMMERSION LITHOGRAPHY

BACKGROUND

The present application relates to immersion lithography in integrated circuit manufacturing.

An integrated circuit ("IC") integrates a large number of electronic circuit elements, including transistors. The circuit elements are manufactured and interconnected internally on a semiconductor substrate, e.g., on a single crystalline silicon wafer. During manufacturing, the wafers undergo cycles of film deposition and lithography. Film deposition is the process of depositing a layer of material, e.g., insulating or metallic, over the entire substrate; lithography is the process of patterning the deposited layer. The first step in lithography involves coating the wafer with photoresist that is sensitive to particular radiation, typically ultra-violet light. During the next step—exposure—the substrate is exposed to a radiation pattern stored on a mask, also called a reticle. Radiation locally changes the physical or chemical properties of the photoresist, and the exposed (or unexposed) areas are selectively dissolved during a developing step that leaves behind a pattern of photoresist. The patterned photoresist provides a pattern for a subsequent etching step. The etching step removes undesired areas of the deposited layer, leaving behind circuit elements, such as wires, resistors and transistors.

Highly integrated circuits require small circuit elements. Since the radiation pattern shapes the circuit elements, the smallest feature size depends on the resolution achieved in the lithography exposure step, or the resolution of the projection device used to project the radiation pattern onto the substrate. According to the Raleigh criterion, this resolution is proportional to the wavelength $\lambda$ of the projected light and to an adjustment factor $k_1$, and inversely proportional to the sine function of the marginal, or capture, angle $\theta$ of the projection optics:

$$\text{Resolution} = k_1 * \lambda / \sin(\theta). \tag{1}$$

The resolution can be decreased, i.e., improved, in one of three ways. First, the wavelength $\lambda$ of the projected light can be decreased. A shorter wavelength, however, may require new photoresist and a number of changes in the projection device, such as using a different light source and light filters, and special lenses for the projection optics. Second, the resolution can be decreased by decreasing the adjustment factor $k_1$. Decreasing $k_1$ may also require the use of different photoresist and high precision tools. Third, the marginal angle $\theta$ can be increased by increasing the size of the projection optics. The effect of this increase, however, is limited by the sine function in Equation 1.

DESCRIPTION OF DRAWINGS

Like reference symbols in the various drawings indicate like elements.

DETAILED DESCRIPTION

Figure 1:
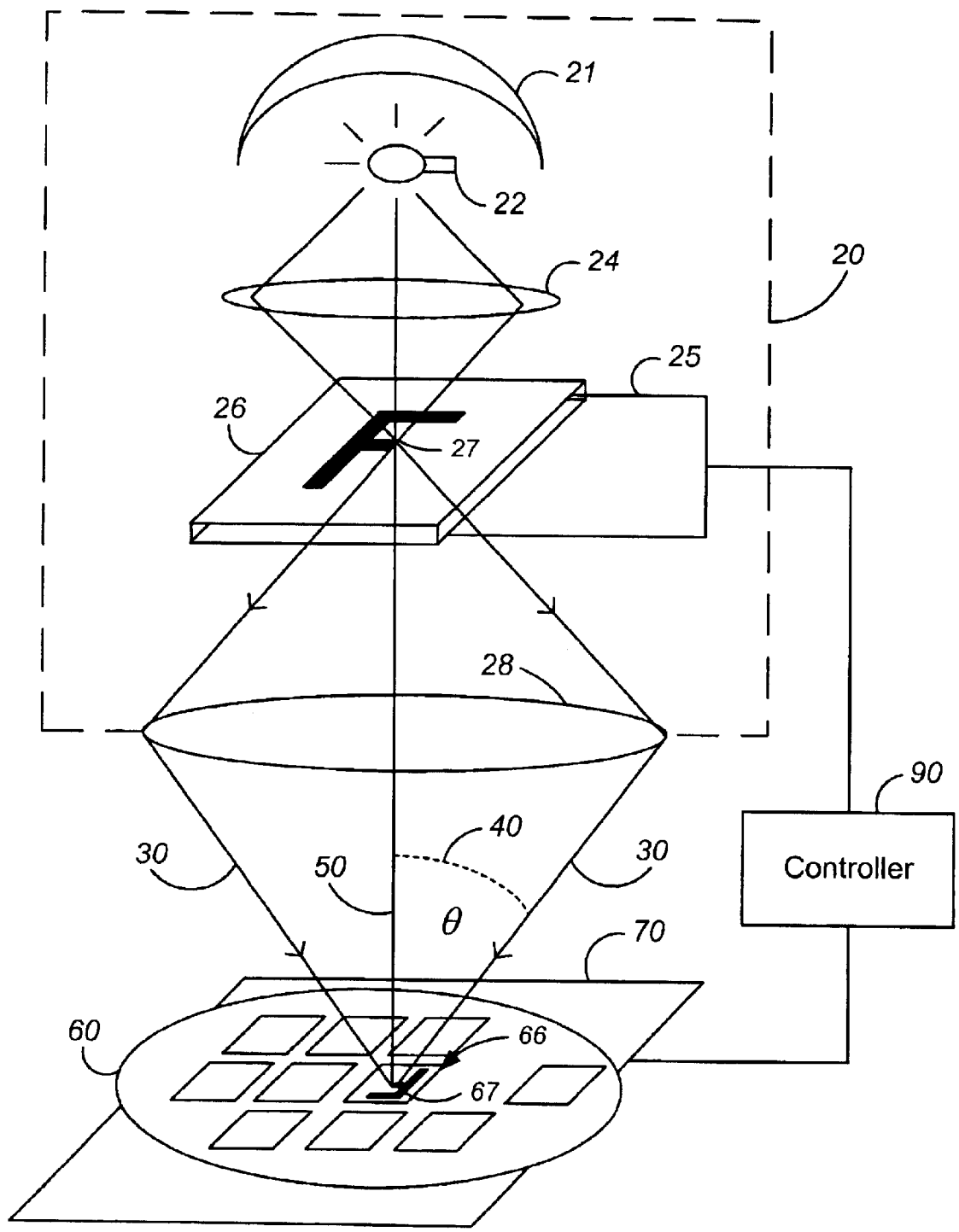
FIG. 1 is a prior art schematic diagram showing a lithographic system.

As shown in FIG. 1, a standard lithographic device 20 projects light onto a wafer 60 to image a mask 26 onto a target surface, such as a substrate surface 66. The wafer 60 is held by a wafer holder 70 and the mask 26 is held in place by a mask holder 25. The wafer holder 70 and the mask holder 25 can be controlled by a controller 90, which can independently move the mask 26, the wafer 60, or both. In an implementation of the lithographic device 20, a light source 22 emits light that is focused on a point 27 of the mask 26, e.g., by a mirror 21 and a condensation lens 24. The mask 26 is imaged onto the substrate surface 66 by projection optics 28. The projection optics 28 collect light coming from the point 27 of the mask 26 and project this light to an image point 67 on the substrate surface 66. The projection optics 28 can be characterized by a marginal angle $\theta$ (40) that describes the incident angle of marginal rays 30 with respect to an optical axis 50 of the projection optics 28.

Figure 2:
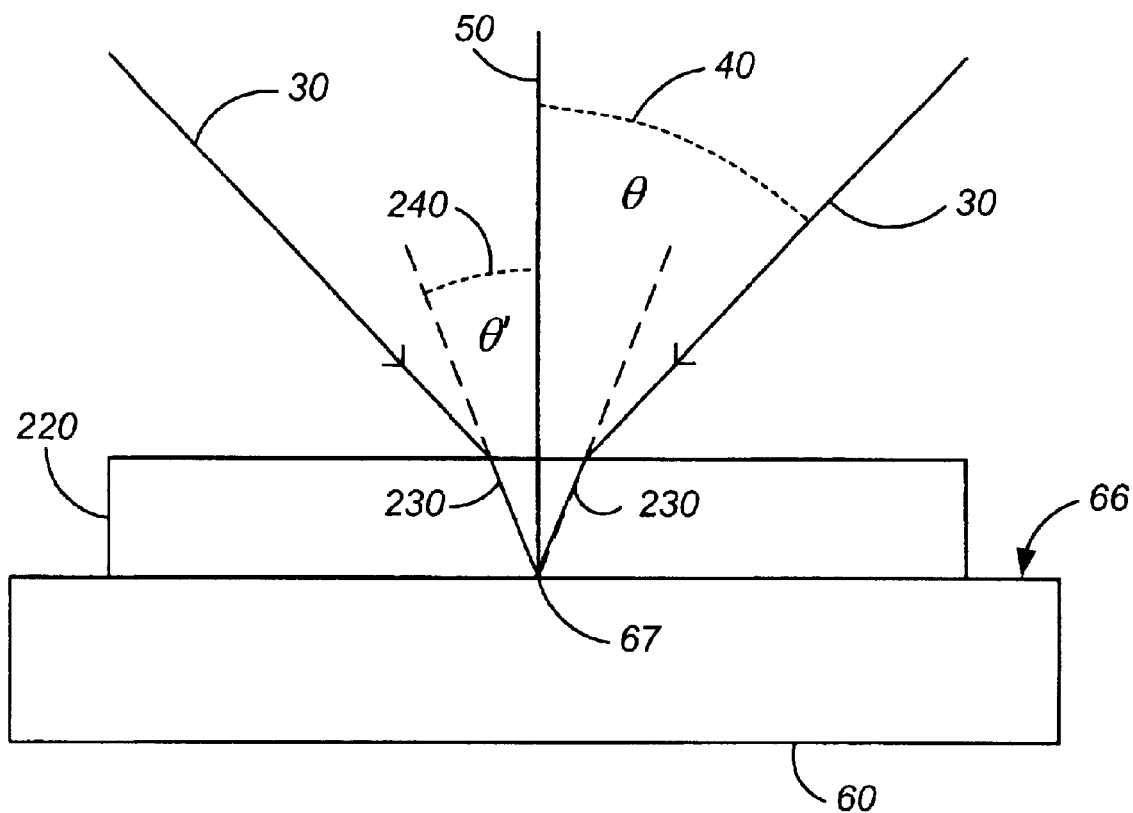
FIG. 2 is a prior art schematic diagram showing light paths near the wafer during an exposure step of lithography.

As shown in FIG. 2 in more detail, the substrate surface 66 can be covered by a photoresist 220. The marginal rays 30 refract at the outer surface of the photoresist 220, and the refraction decreases the marginal angle $\theta$ (40), to a refracted angle $\theta'$ (240). The refracted angle $\theta'$, 240, depends on the refractive index $n_r$ of the photoresist 220, typically around $n_r=1.7$. The relationship is described by Snell's law: the sine of the refracted angle $\theta'$ (240) is proportional to the sine of the marginal angle $\theta$ (40) and to the inverse of the refractive index $n_r$:

$$\sin(\theta') = \sin(\theta)/n_r \tag{2}$$

The photoresist 220 also changes the wavelength $\lambda$ of the marginal rays 30 to $\lambda'$ for refracted rays 230: similarly to the change of marginal angles, the wavelength $\lambda'$ is proportional to the inverse of the refractive index $n_r$:

$$\lambda' = \lambda/n_r \tag{3}$$

When applying Equation 1 for the photoresist 220, as described by Equations 2 and 3, the wavelength decrease cancels the effect of the marginal angle decrease. Consequently, in the implementation of the lithographic system shown in FIG. 2, the photoresist 220 has no effect on the resolution of the projected image.

Figure 3:
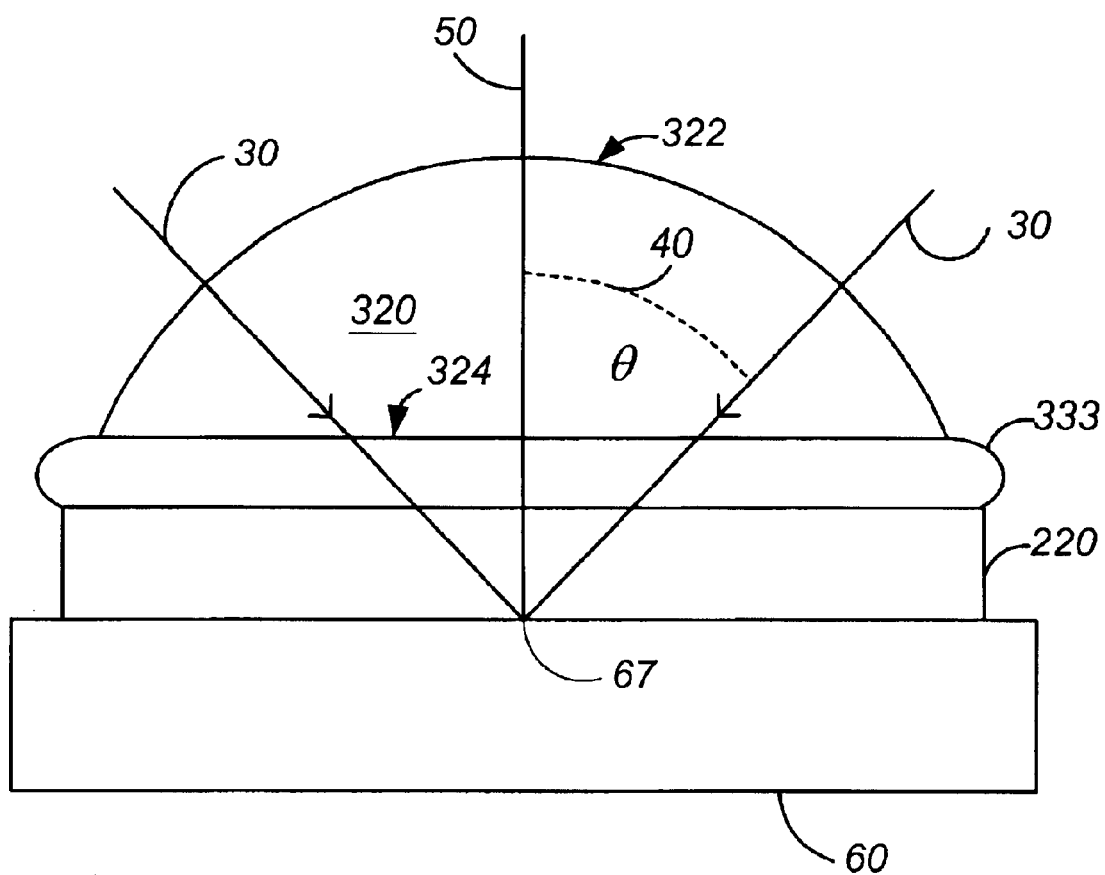
FIGS. 3 and 4 are schematic diagrams showing immersion lithographic apparatuses and corresponding light paths according to implementations of the application.

As shown in FIG. 3, in a lithographic system, resolution can be improved by an immersion technique that takes advantage of the wavelength change in the photoresist, but avoids the change of the marginal angle $\theta$ (40). The implementation features a converging lens, for example, a hemispherical lens 320 that may be centered on the optical axis 50. The projected light, including the marginal rays 30, enters the hemispherical lens 320 at a hemispherical surface 322. Furthermore, the hemispherical lens has an immersed surface 324 separated from the photoresist 220 by a gap filled with an immersion liquid 333. The immersed surface 324 may be flat. Alternatively, the immersed surface may have a curvature.

As implemented, the projected light goes through different optical media: the hemispherical lens 320, the immersion liquid 333, and the photoresist 220. If the optical media are designed with essentially equal refractive indices, the projected light does not refract at interfaces between the different optical media. In alternative implementations, when the hemispherical lens 320 has a substantially different refractive index than the photoresist 220, an immersion liquid can be introduced that has essentially the same refractive index as either the hemispherical lens 320 or the photoresist 220, or has a refractive index in between the two refractive indices. If there is a substantial difference between the refractive indices of the hemispherical lens and the immersion liquid, the immersed surface 324 may be concave. A concave immersed surface may decrease aberrations.

As the implementation in FIG. 3 shows, the hemispherical lens 320 may be centered on the optical axis 50 so that the marginal rays 30 do not refract upon entering the hemispherical lens 320. To minimize spherical aberrations, in this implementation, the image point 67 is also the center of the hemisphere defining the hemispherical lens 320. The lack of retraction gives the same marginal angle near the image point 67 as the marginal angle θ (40) of the projection optics 28. At the same time, the wavelength λ of the projected light is decreased to λ' by the refractive index $n_r$ in the photoresist 220 (see Equation 3). Consequently, according to Equation 1, the resolution is improved by a factor of $n_r$.

Figure 4:
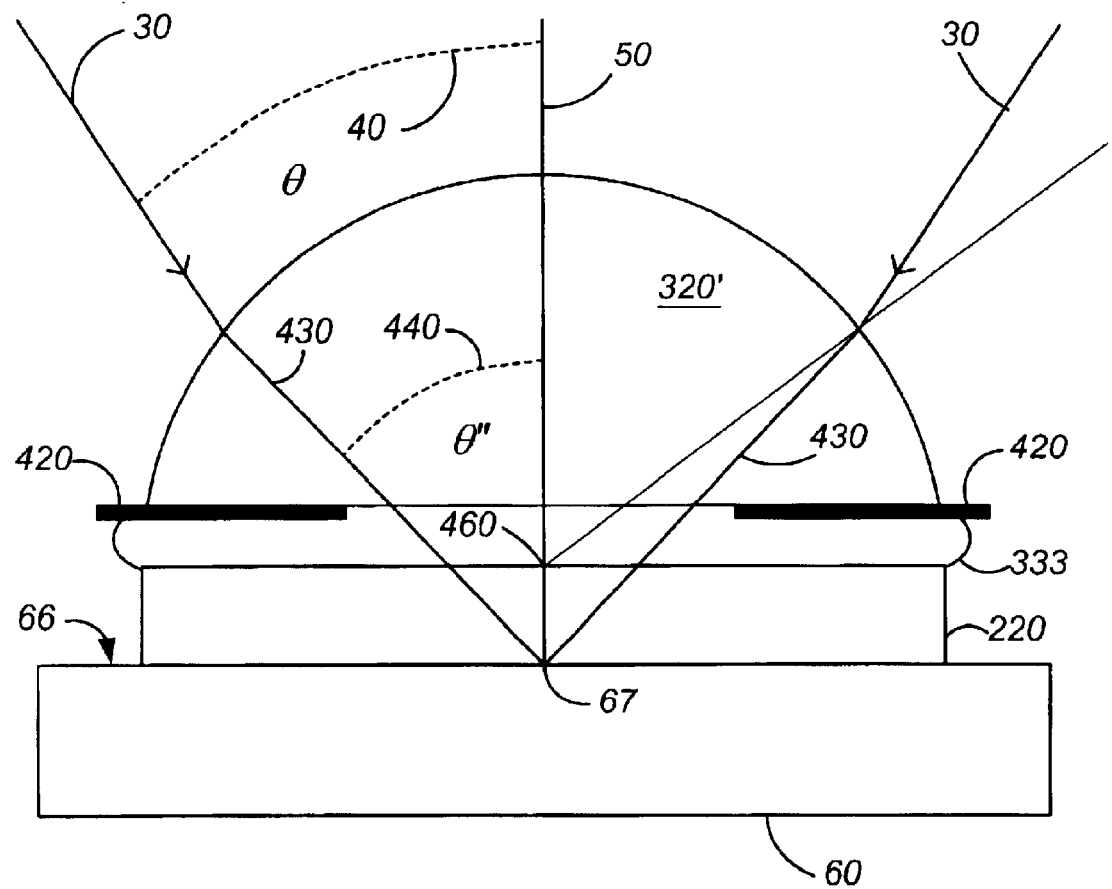

As shown in FIG. 4, a lithographic system can be implemented to improve resolution while minimizing aberrations. This implementation features a hemispherical lens 320' positioned above the photoresist 220 and immersed into the immersion liquid 333. The hemispherical lens 320' has a hemispherical outer surface that is centered at a center 460. The center 460 is located on the optical axis 50 above the image point 67, where refracted marginal rays 430 converge. The image point 67 may be an aplanatic point of the hemispherical lens 320'. When entering the hemispherical lens 320', the marginal rays 30 refract towards the center 460 and, consequently, the marginal angle θ (40) increases to a refracted angle θ" (440). The marginal angle increase is due to the relative position of the image point 67 with respect to the center 460: changing this relative position can increase or decrease the refracted angle θ" (440). The refracted angle θ" (440) can remain unchanged in the photoresist 220 if there is no further refraction at the interfaces between the relevant optical media: the hemispherical lens 320', the immersion liquid 333, and the photoresist 220. As explained above with reference to FIG. 3, refraction can be avoided by matching the refractive indices of the optical media. According to Equation 1, the resolution is clearly improved in this implementation: for the refracted marginal rays 430 that converge to the image point 67, the refracted angle θ" increases and the wavelength λ' decreases.

As the implementation in FIG. 4 shows, an aperture element 420 can be used to limit the area on the substrate surface 66 exposed to the projected light. The aperture element 420 defines an aperture to minimize aberrations that are introduced by the hemispherical lens 320'. The aperture element 420 may be placed between the hemispherical lens 320' and the photoresist 220. Optionally, the aperture element 420 may be implemented as a metal coat on the flat surface of the hemispherical lens 320'. The metal coat may be a chrome coat; the aperture may have a diameter of about 10 microns.

As shown in FIG. 1, in order to expose another substrate surface 66 to the projected light, the controller 90 can instruct the wafer holder 70 and the a mask holder 25 to scan a larger surface area.

Figure 5:
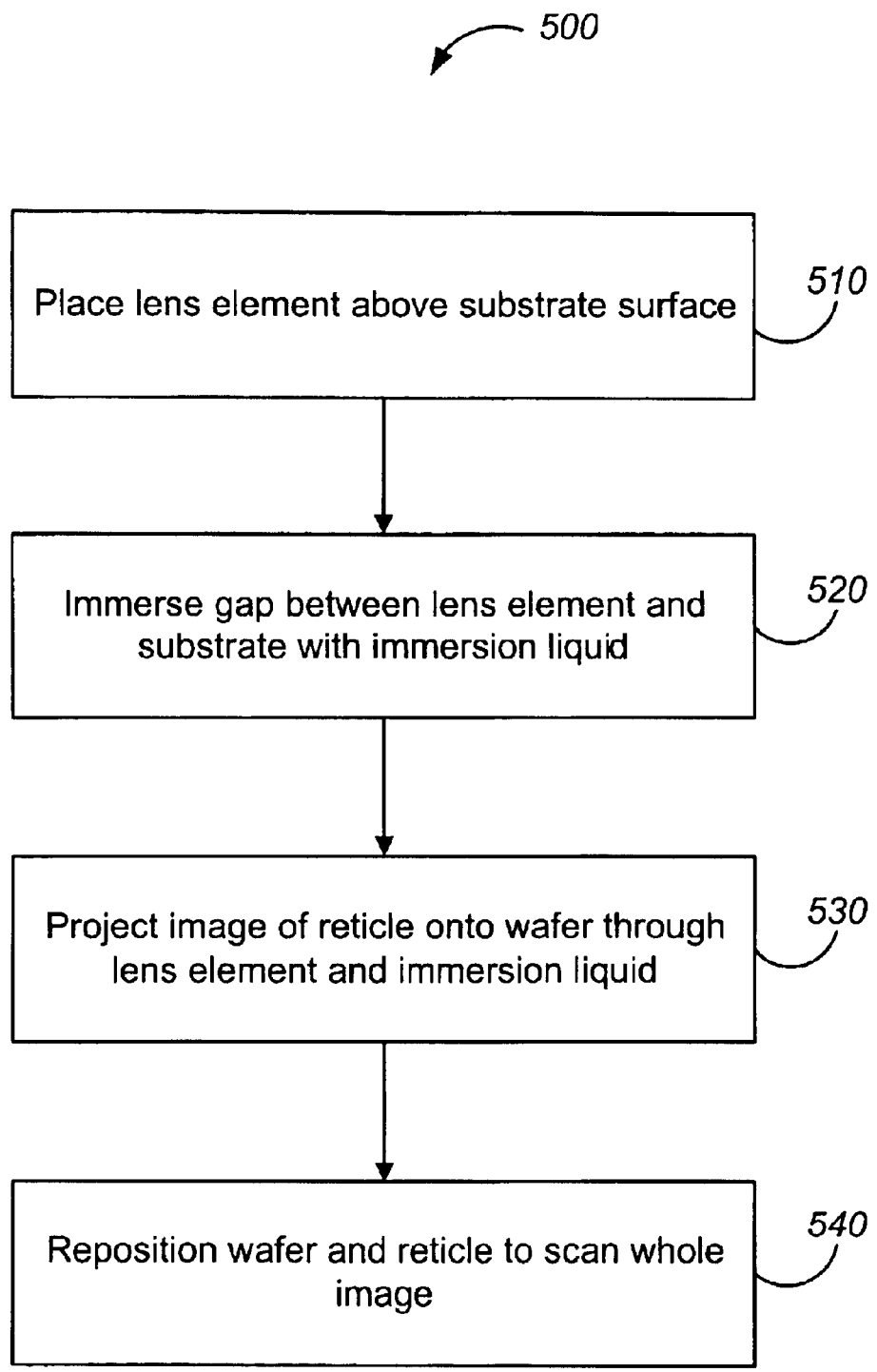
FIG. 5 is a flowchart showing a method for immersion lithography.

As shown in FIG. 5, a method 500 can perform steps necessary to implement immersion lithography. In one implementation, the method 500 starts with placing a lens element above a substrate surface of a wafer (step 510). The lens element may be a hemispherical lens element, similar to the hemispherical lens 320 of FIG. 3; the substrate surface may be covered with a photoresist; the wafer may be in a wafer holder of a lithographic system (see, e.g., FIGS. 1–2). The lens element may be centered on an optical axis of the lithographic system (see FIG. 3). Optionally, the placement may be verified, e.g., with an interferometer, and fine tuned, e.g., with a piezo electric transducer. Next, the lens element is immersed into an immersion liquid to fill the gap between the lens element and the substrate surface (step 520). When the substrate surface is covered with a photoresist, the immersion liquid may fill the gap between the lens element and the photoresist. After immersion, a lithographic device may project an image of a mask onto the substrate surface through the lens element and the immersion liquid (step 530). The substrate surface may be exposed to the projected image for a time that allows desired physical or chemical changes in the photoresist covering the substrate surface. After exposure, the projected image may be scanned by repositioning the reticle and the wafer (step 540). The repositioning may be controlled by a controller of the lithographic system as explained above.

A number of embodiments of the invention have been described. Nevertheless, it will be understood that various modifications may be made without departing from the spirit and scope of the invention. For example, the hemispherical lens can be replaced by a lens with any convex outer surface. Accordingly, other embodiments are within the scope of the following claims.

What is claimed is:

1. An apparatus for lithograpy, comprising:
   a lens element comprising an immersed surface and a convex surface opposite the immersed surface, the convex surface being defined by a hemisphere, the center of the hemisphere being substantially at a target surface, the lens element positioned to focus a projected light onto the target surface, and to image a point of a mask onto the target surface; and
   an immersion liquid between the target surface and the lens element, the projected light entering the immersion liquid after leaving the immersed surface of the lens element.

2. The apparatus of claim 1, wherein the target surface bears a photoresist.

3. The apparatus of claim 2, wherein the photoresist and the immersion liquid are characterized by essentially equal refractive indices.

4. The apparatus of claim 1, wherein the target surface comprises a substrate surface of a wafer.

5. The apparatus of claim 1, wherein the lens element and the immersion liquid are characterized by essentially refractive indices.

6. The apparatus of claim 1, wherein the lens element minimizes refraction of the projected light entering the lens element at the convex surface.

7. The apparatus of claim 1, wherein the immersion liquid is characterized by a refractive index that is substantially larger than 1.0.

8. The apparatus of claim 1, further comprising:
   an aperture element defining an aperture, and positioned between the immersed surface of the lens element and the target surface, the aperture element limiting the area of the target surface exposed to the projected light.

9. The apparatus of claim 8, wherein the aperture has a diameter of approximately 10 microns.

10. The apparatus of claim 1, wherein the immersed surface of the lens element comprises a flat surface.

11. The apparatus of claim 1 wherein the immersed surface of the lens element comprises a concave surface.

12. A method for lithography, comprising:
   positioning a lens element comprising an immersed surface and a convex surface opposite the immersed surface, the convex surface being defined by a hemisphere, the center of the hemisphere being substantially at a target surface, the lens element positioned to focus a projected light onto the target surface and to image a point of a mask onto the target surface; and juxtaposing an immersion liquid between the target surface and the lens element, the projected light entering the immersion liquid after leaving the immersed surface of the lens element.

13. The method of claim 12, wherein the target surface bears a photoresist, and the immersion liquid and the photoresist are characterized by essentially equal refractive indices.

14. The method of claim 12, wherein positioning the lens element comprises adjusting the position of the lens element to minimize refraction of the projected light entering the lens element at the convex surface.

15. The method of claim 12, further comprising:

repositioning the target surface or the mask to image another point of the mask onto the target surface.

16. A lithographic system, comprising:

a projection device operable to project light on a target surface, the projected light imaging a point of a mask onto the target surface, the projection device having characteristic resolution, the projected light having a characteristic wavelength; and a lens element comprising an immersed and a convex surface opposite the immersed surface, the convex surface being defined by a hemisphere, the center of the hemisphere being substantially at the target surface, the immersed surface of the lens element being immersed in an immersion liquid to improve the characteristics resolution of the projection device by decreasing the characteristic wavelength as the light reaches the target surface.

17. The lithographic system of claim 16, wherein the target surface bears a photoresist, and the immersion liquid and the photoresist are characterized by essentially equal refractive indices.

18. The lithographic system of claim 16, wherein the lens element minimizes refraction of the projected light entering the lens element at the convex surface.

19. The lithographic system of claim 16, further comprising:

a scanning device to reposition the target surface or the mask image another point of the mask onto the target surface.

* * * * *